(12) United States Patent
Lin et al.

(10) Patent No.: US 12,139,399 B2
(45) Date of Patent: Nov. 12, 2024

(54) CONDUCTIVE BOND STRUCTURE TO INCREASE MEMBRANE SENSITIVITY IN MEMS DEVICE

(71) Applicant: Taiwan Semiconductor Manufacturing Company, Ltd., Hsin-Chu (TW)

(72) Inventors: Hung-Hua Lin, Taipei (TW); Chia-Ming Hung, Taipei (TW); Xin-Hua Huang, Xihu Township (TW); Yuan-Chih Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 12 days.

(21) Appl. No.: 17/706,863

(22) Filed: Mar. 29, 2022

(65) Prior Publication Data

US 2022/0219973 A1  Jul. 14, 2022

Related U.S. Application Data

(62) Division of application No. 16/601,749, filed on Oct. 15, 2019, now Pat. No. 11,292,715.

(Continued)

(51) Int. Cl.
*B81C 3/00* (2006.01)
*B81B 3/00* (2006.01)
(Continued)

(52) U.S. Cl.
CPC ............ *B81C 3/001* (2013.01); *B81B 7/0006* (2013.01); *B81B 2203/0127* (2013.01);
(Continued)

(58) Field of Classification Search
CPC . B81C 1/00285; B81C 1/00182; B81C 3/001; B81C 1/00158; B81C 2203/03;
(Continued)

(56) References Cited

U.S. PATENT DOCUMENTS 7,148,077 B2   12/2006   Fuertsch et al.
10,065,851 B2   9/2018   Bryzek
(Continued)

FOREIGN PATENT DOCUMENTS

JP   2010145260 A   7/2010

OTHER PUBLICATIONS

Non-Final Office Action dated May 13, 2021 for U.S. Appl. No. 16/601,749.
(Continued)

*Primary Examiner* — Antonio B Crite
(74) *Attorney, Agent, or Firm* — Eschweiler & Potashnik, LLC

(57) ABSTRACT

Various embodiments of the present disclosure are directed towards a method for forming an integrated chip, where the method includes forming an interconnect structure over a first substrate. A dielectric structure is formed over the interconnect structure. The dielectric structure comprises opposing sidewalls defining an opening. A conductive bonding structure is formed on a second substrate. A bonding process is performed to bond the conductive bonding structure to the interconnect structure. The conductive bonding structure is disposed in the opening. The bonding process defines a first cavity between inner opposing sidewalls of the conductive bonding structure and a second cavity between the conducive bonding structure and the opposing sidewalls of the dielectric structure.

20 Claims, 9 Drawing Sheets

Related U.S. Application Data

(60) Provisional application No. 62/867,446, filed on Jun. 27, 2019.

(51) Int. Cl.
 *B81B 7/00* (2006.01)
 *B81B 7/02* (2006.01)
 *B81C 1/00* (2006.01)

(52) U.S. Cl.
 CPC ... *B81B 2207/07* (2013.01); *B81C 2201/0176* (2013.01); *B81C 2203/019* (2013.01); *B81C 2203/037* (2013.01)

(58) Field of Classification Search
 CPC ... B81C 1/0292; B81C 3/0021; B81B 7/0038; B81B 7/0006; B81B 2207/07; B81B 3/0021
 See application file for complete search history.

(56) References Cited

U.S. PATENT DOCUMENTS

| | | |
|---|---|---|
| 2009/0159410 A1 | 6/2009 | Wang et al. |
| 2013/0056841 A1 | 3/2013 | Hsieh et al. |
| 2013/0277772 A1 | 10/2013 | Bryzek |
| 2014/0042596 A1 | 2/2014 | Alley et al. |
| 2014/0252508 A1 | 9/2014 | Cheng et al. |
| 2017/0107100 A1 | 4/2017 | Cheng et al. |
| 2017/0210612 A1* | 7/2017 | Chen ................. B81B 3/001 |
| 2017/0297904 A1* | 10/2017 | Lin ................. B81C 1/00285 |
| 2017/0365774 A1 | 12/2017 | Rothberg et al. |
| 2018/0104694 A1 | 4/2018 | Huff et al. |
| 2018/0148327 A1* | 5/2018 | Chang ............. B81C 1/00269 |
| 2019/0062151 A1 | 2/2019 | Cheng et al. |

OTHER PUBLICATIONS

Final Office Action dated Sep. 9, 2021 for U.S. Appl. No. 16/601,749.
Notice of Allowance dated Dec. 3, 2021 for U.S. Appl. No. 16/601,749.

* cited by examiner

CONDUCTIVE BOND STRUCTURE TO INCREASE MEMBRANE SENSITIVITY IN MEMS DEVICE

REFERENCE TO RELATED APPLICATIONS

This application is a Divisional of U.S. application Ser. No. 16/601,749, filed on Oct. 15, 2019, which claims the benefit of U.S. Provisional Application No. 62/867,446, filed on Jun. 27, 2019. The contents of the above-referenced patent applications are hereby incorporated by reference in their entirety.

BACKGROUND

Microelectromechanical systems (MEMS) devices, such as accelerometers, pressure sensors, microphones, and transducers, have found widespread use in many modern day electronic devices. For example, MEMS accelerometers and transducers are commonly found in automobiles (e.g., in airbag deployment systems), tablet computers, or in medical devices. MEMS devices may have a moveable part, which is used to detect a motion, and convert the motion to an electrical signal. For example, a MEMS accelerometer includes a moveable part that transfers accelerating movement to an electrical signal. A transducer includes a moveable membrane that transfers sound waves to an electrical signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
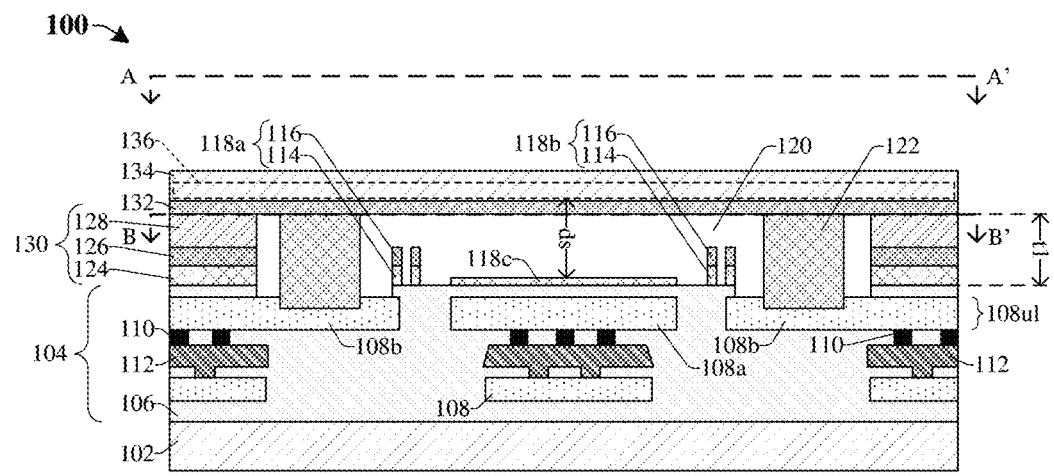
FIG. 1 illustrates a cross-sectional view of some embodiments of a microelectromechanical systems (MEMS) device having a conductive bond structure surrounded by a dielectric structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A microelectromechanical systems (MEMS) device used for acoustical applications (e.g., capacitive micro-machined ultrasonic transducers (CMUTs)) often includes a moveable membrane disposed above and/or within a cavity. The cavity is defined between a MEMS substrate and a carrier substrate. The MEMS substrate includes a moveable membrane over the cavity and a cavity electrode disposed below the moveable membrane. During operation, ultrasonic sound waves may cause the moveable membrane to move towards or away from the cavity electrode, such that a change in capacitance may be detected between the membrane electrode and the cavity electrode. This change in capacitance may be converted into an electrical signal and may be transferred to contact electrodes that are electrically coupled to the cavity electrode and/or the membrane electrode. A range of capacitance values that may be sensed by the MEMS device is defined by a height of the cavity (i.e., a sensing gap). The sensing gap of the MEMS device may be specific to each application, where having an inaccurate sensing gap may adversely affect the performance and/or sensitivity of the MEMS device.

A challenge with the aforementioned structure may arise during fabrication of the MEMS device. The MEMS substrate may be fusion bonded to the carrier substrate by way of a dielectric bonding structure disposed between the MEMS and carrier substrates. A thickness of the dielectric bonding structure may define a height of the cavity and/or the sensing gap. Due to current processing tool limitations, it may be difficult to accurately define a desired thickness of the dielectric bonding structure. During fabrication of the dielectric bonding structure, multiple dielectric layers are deposited over the carrier substrate. After depositing the multiple dielectric layers, a planarization process (e.g., a chemical mechanical planarization (CMP) process) is performed on the multiple dielectric layers to achieve the desired thickness for the dielectric bonding structure and define a substantially flat upper surface of the dielectric bonding structure. The substantially flat upper surface is configured to facilitate a strong bond between the MEMS substrate and the dielectric bonding structure. However, due to processing tool limitations, it may be difficult to control the planarization process in order to define a dielectric bonding structure with the desired thickness (e.g., within a range of about 2,400 to 2,800 Angstroms) and the substantially flat upper surface.

For example, the multiple dielectric layers may have an initial thickness (e.g., greater than 6,000 Angstroms) substantially greater than the desired thickness. The planarization process may have a tolerance of about 1,000 Angstroms, such that a thickness of the dielectric bonding structure after performing the planarization process may be within a range of about 1,600 to 3,600 Angstroms. An inability to accurately set the thickness of the dielectric bonding structure may result in a poor and/or inaccurate sensing gap between the moveable membrane and the cavity electrode, thereby mitigating a sensitivity of the MEMS device. Furthermore, without the planarization process, the upper surface of the dielectric bonding structure may not be substantially flat. This in turn may result in a poor bond interface between the dielectric bonding structure and the MEMS substrate, thereby resulting in lifting and/or delamination between the MEMS substrate and the carrier substrate. Further, in some embodiments, the deposition process and planarization process may be repeated more than once to achieve the substantially flat upper surface and the suitable thickness of the dielectric bonding structure. This increases a time and cost associated with forming the MEMS device.

The present disclosure, in some embodiments, relates to MEMS device with an accurately defined sensing gap. For example, the MEMS device includes a MEMS substrate overlying a carrier substrate. A conductive bonding structure is disposed between the MEMS substrate and the carrier substrate. A dielectric structure laterally surrounds the conductive bonding structure and is between the MEMS substrate and the carrier substrate. A cavity is disposed between the MEMS substrate and the carrier substrate, in which a moveable membrane overlies the cavity. A cavity electrode is disposed under the moveable membrane along a lower surface of the cavity. During a process for forming the MEMS device, the dielectric structure is deposited by a deposition process (e.g., high density plasma (HDP) chemical vapor deposition (CVD)) with high thickness control. This in turn facilities accurately defining a thickness of the dielectric structure (e.g., within a range of +/−5% of a target thickness) and decreases costs and time associated with fabricating the dielectric structure (e.g., omitting a CMP process). The MEMS substrate is bonded to the carrier substrate by a eutectic bond, where the dielectric structure is configured to function as a bond stop structure during the eutectic bond. Thus, the height of the cavity is defined by the thickness of the dielectric structure. Because the thickness of the dielectric structure is easily controlled, a sensing gap between the moveable membrane and the cavity electrode may be easily set. This in turn increases a sensitivity of the MEMS device, while reducing time and costs associated with forming the MEMS device.

FIG. 1 illustrates a cross-sectional view of some embodiments of a microelectromechanical systems (MEMS) device 100 having a conductive bond structure 122 surrounded by a dielectric structure 130.

The MEMS device 100 includes an interconnect structure 104 overlying a substrate 102. The interconnect structure 104 includes an interconnect dielectric structure 106, a plurality of conductive wires 108, a plurality of conductive vias 110, and a redistribution layer 112. In some embodiments, semiconductor devices (e.g., transistors, capacitors, resistors, etc.) (not shown) are disposed on and/or within the substrate 102 and are electrically coupled to the conductive wires 108, the conductive vias 110, and the redistribution layer 112. An upper layer 108u1 of the conductive wires 108 includes a conductive bond layer 108b and a cavity electrode 108a.

A MEMS substrate 134 overlies the interconnect structure 104 and an isolation dielectric layer 132 is disposed along a lower surface of the MEMS substrate 134. A cavity 120 is defined between a lower surface of the isolation dielectric layer 132 and an upper surface of the interconnect structure 104. In some embodiments, the cavity electrode 108a is disposed within the interconnect dielectric structure 106 and underlies the cavity 120. A dielectric structure 130 is disposed between the interconnect structure 104 and the isolation dielectric layer 132. The dielectric structure 130 includes a first dielectric layer 124 overlying the interconnect dielectric structure 106, a second dielectric layer 126 overlying the first dielectric layer 124, and a third dielectric layer 128 overlying the second dielectric layer 126. In some embodiments, the dielectric structure 130 has a thickness t1 defined from an upper surface of the third dielectric layer 128 to a lower surface of the first dielectric layer 124. In some embodiments, the thickness t1 is within a range of about 2,400 to 2,800 Angstroms. In further embodiments, the thickness t1 may, for example, be within a range of about 100 nanometers to about 1 micrometer. In some embodiments, the thickness t1 depends upon a value specified by a customer. The conductive bond structure 122 is laterally offset from the dielectric structure 130 and is disposed between the conductive bond layer 108b and the isolation dielectric layer 132. The cavity 120 is defined between sidewalls of the conductive bond structure 122, and between a lower surface of the isolation dielectric layer 132 and an upper surface of the interconnect structure 104. In some embodiments, sidewalls of the conductive bond structure 122 are defined from a cross-sectional view. For example, if when viewed from above the conductive bond structure 122 is ring shaped or circular/elliptical then the sidewalls are a single continuous sidewall when viewed from above, therefore "sidewalls" refers to the nature of this single continuous sidewall when depicted in in a cross-sectional view. Additionally, if when viewed from above the conductive bond structure 122 is ring shaped, circular, or elliptical then any length and/or width associated with a cross-sectional view of the structure(s) and/or layer(s) comprising the conductive bond structure 122 respectively correspond to diameters of a circle or lengths defined between two vertices on the major axis of an ellipse.

In some embodiments, a moveable membrane 136 is disposed within the MEMS substrate 134. For example, in some embodiments, the moveable membrane 136 may be a doped region of the MEMS substrate 134. In such embodiments, the MEMS substrate 134 may comprise a first doping type (e.g., p-type) and the moveable membrane 136 may comprise a second doping type (e.g., n-type) opposite the first doping type. In further embodiments, the moveable membrane 136 may be a conductive electrode disposed along a lower surface or an upper surface of the MEMS substrate 134 (not shown) (see for example, FIG. 5A). During operation of the MEMS device 100, the moveable membrane 136 is configured to move towards or away from the cavity electrode 108a such that a change in capacitance between the moveable membrane 136 and the cavity electrode 108a may be detected. The change in capacitance may be converted into an electrical signal and may be transferred to the semiconductor devices disposed on the substrate 102 and/or other semiconductor devices (not shown) by way of the interconnect structure 104. For example, a position of the moveable membrane 136 may be displaced due to a sound wave (e.g., an ultrasonic signal) disposed upon the MEMS device 100. In such embodiments, the MEMS device 100 may be configured as a capacitive micromachined ultrasonic transducer (CMUT).

In some embodiments, a range of capacitance values between the moveable membrane 136 and the cavity electrode 108a may be defined by a distance ds. The distance ds is defined between an upper surface of a third stopper structure 118c and the moveable membrane 136. As the distance ds increases the range of capacitance values increases, and as the distance ds decreases the range of capacitance values decreases. In some embodiments, during fabrication of the MEMS device 100, the distance ds is defined by setting the thickness t1 of the dielectric structure 130 to a predefined value. By accurately setting the thickness t1 of the dielectric structure 130 to the predefined value, a sensitivity (i.e., the range of capacitance values) of the MEMS device 100 may be defined. However, if the thickness t1 of the dielectric structure 130 is inaccurately defined, the sensitivity of the MEMS device 100 may be improper for the specific application. This, in turn, may adversely affect a performance of the MEMS device 100 for the specific application.

In some embodiments, the conductive bond structure 122 is omitted (not shown) and the dielectric structure 130 may be configured as a dielectric bond structure. In such embodiments, in order to achieve a strong bond interface with the isolation dielectric layer 132 a planarization process (e.g., a chemical mechanical planarization (CMP) process) is performed on the dielectric structure 130 such that the dielectric structure 130 has a substantially flat upper surface upper surface. However, due to processing tool limitations (e.g., a tolerance of the CMP process) it may be difficult to form the substantially flat upper surface while accurately defining the thickness t1. Thus, in some embodiments according to the present disclosure, in order to achieve a strong bond between the substrate 102 and the MEMS substrate 134 and an accurate thickness t1, the dielectric structure 130 may be deposited with a deposition process having high thickness control and the conductive bond structure 122 is bonded to the interconnect structure 104 by a eutectic bond. For example, formation of the dielectric structure 130 may include a deposition process (e.g., high density plasma (HDP) chemical vapor deposition (CVD)) that has a high control of the thickness t1 (i.e., forming the dielectric structure 130 to a predefined thickness with an error within a range of +/−5%). Further, the conductive bond structure 122 is bonded to the conductive bond layer 108b by a eutectic bond, thereby achieving a strong bond between the MEMS substrate 134 and the substrate 102. During the eutectic bond process, a thickness of the conductive bond structure 122 may be reduced as the conductive bond structure 122 bonds with the conductive bond layer 108b. Reduction of the thickness of the conductive bond structure ceases when an upper surface of the isolation dielectric layer 132 contacts an upper surface of the dielectric structure 130. Thus, the dielectric structure 130 acts as a bond stop structure, such that the thickness t1 may define the distance ds. Therefore, a strong bond may be achieved between the conductive bond structure 122 and the conductive bond layer 108b while accurately defining the distance ds. This in turn increases a reliability, a structural integrity, and a sensitivity of the MEMS device 100.

In some embodiments, a plurality of stopper structures 118a-c may be disposed along an upper surface of the interconnect dielectric structure 106. During operation of the MEMS device 100, the stopper structures 118a-c are each configured to prevent the moveable membrane 136 from becoming stuck to and/or attached to the interconnect dielectric structure 106. In some embodiments, each of the stopper structures 118a-c may have a rough upper surface configured to prevent stiction with the isolation dielectric layer 132 and/or moveable membrane 136. This in turn may prevent the moveable membrane 136 from becoming stuck and/or unable to move in response to a sound wave, thereby increasing an endurance, reliability, and performance of the MEMS device 100. A first stopper structure 118a and a second stopper structure 118b each comprise a first stopper layer 114 underlying a second stopper layer 116. In some embodiments, a third stopper structure 118c comprises a same material as the first stopper layer 114.

Figures 2A, 2B:
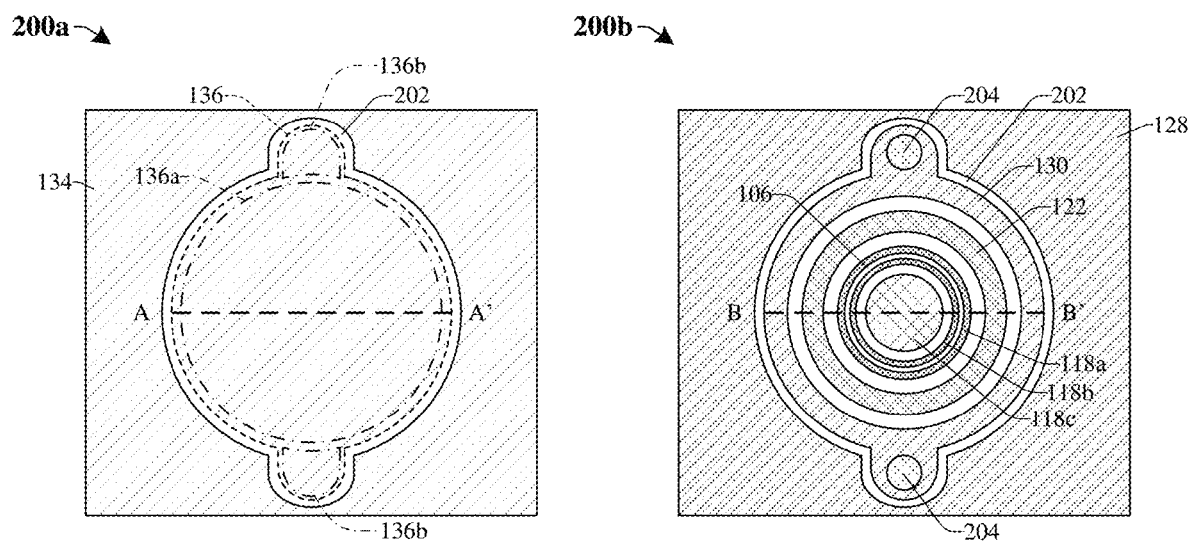
FIGS. 2A-B illustrate top views of some alternative embodiments of the MEMS device of FIG. 1.

FIG. 2A illustrates a top view 200a of some alternative embodiments of the MEMS device 100 of FIG. 1 taken along line A-A'. FIG. 1 illustrates some embodiments of a cross-sectional view of the top view 200a of FIG. 2A taken along the line A-A'.

A trench 202 laterally surrounds the moveable membrane 136. In some embodiments, the trench 202 is configured to electrically and/or mechanically isolate the moveable membrane 136 from other regions, structures, and/or layers (not shown) disposed on the MEMS substrate 134. In further embodiments, the trench 202 extends through an entire thickness of the MEMS substrate 134. As illustrated in FIG. 2A, when viewed from above, the moveable membrane 136 may comprise a central body 136a having a circular or elliptical shape and further comprise rounded protrusions 136b extending from the central body 136a.

FIG. 2B illustrates a top view 200b of some alternative embodiments of the MEMS device 100 of FIG. 1 taken along line B-B'. In some embodiments, in the cross-sectional view of FIG. 1, the line B-B' is disposed along the upper surface of the dielectric structure 130. FIG. 1 illustrates some embodiments of a cross-sectional view of the top view 200b of FIG. 2B taken along the line B-B'.

As illustrated in FIG. 2B, the dielectric structure 130 comprises a central body having a circular and/or elliptical shape and rounded protrusions extending from the central body. Contact vias 204 are disposed within the rounded protrusions and are electrically coupled to the moveable membrane (136 of FIG. 1). The trench 202 continuously surrounds the dielectric structure 130. The dielectric structure 130 continuously surrounds the conductive bond structure 122. In some embodiments, when viewed from above, the conductive bond structure 122 is ring shaped and may be configured to seal the cavity (120 of FIG. 1) with a first gas pressure. When viewed from above, the first and second stopper structures 118a, 118b may have a ring shape and the third stopper structure 118c may have a circular or elliptical shape.

Figure 3:
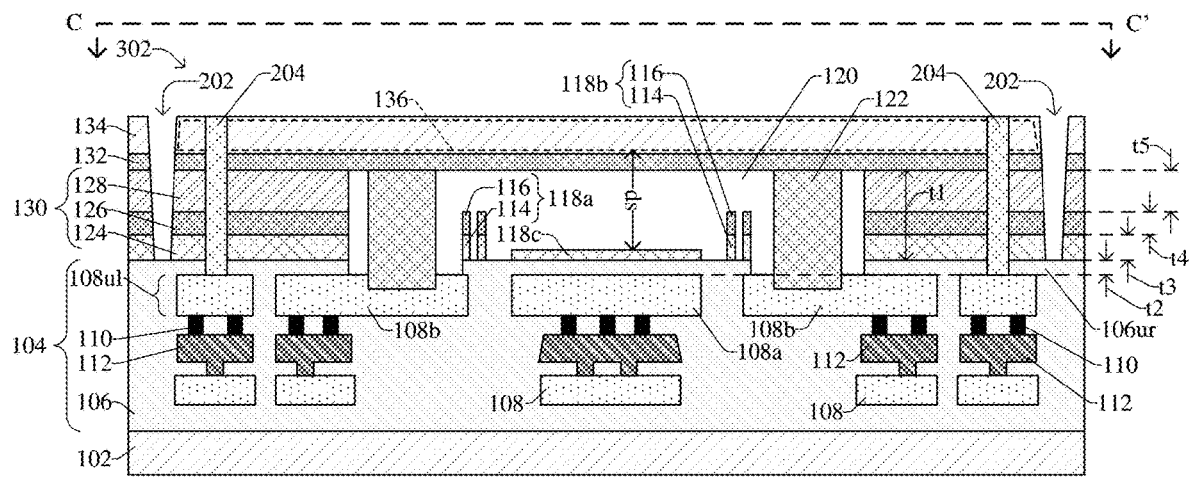
FIG. 3 illustrates a cross-sectional view of some embodiments of an integrated chip including a MEMS device having a dielectric structure laterally surrounding a conductive bond structure.

FIG. 3 illustrates a cross-sectional view of some embodiments of an integrated chip 300 including a MEMS device 302 having a dielectric structure 130 laterally surrounding a conductive bond structure 122.

The integrated chip 300 includes an interconnect structure 104 overlying a substrate 102. In some embodiments, the substrate 102 may, for example, be or comprise a bulk substrate (e.g., a bulk silicon substrate), a silicon-on-insulator (SOI) substrate, or some other suitable substrate. In alternative embodiments, the substrate 102 may be configured as a carrier substrate or as a semiconductor substrate. The interconnect structure 104 includes an interconnect dielectric structure 106, a plurality of conductive wires 108, a plurality of conductive vias 110, and redistribution layer 112. The interconnect dielectric structure 106 may comprise one or more inter-level dielectric (ILD) layers. In some embodiments, the one or more ILD layers may, for example, be or comprise silicon dioxide, a low-k dielectric material, an extreme low-k dielectric material, a combination of the foregoing, or another suitable dielectric material. The conductive wires and/or vias 108, 110 may, for example, be or comprise aluminum, copper, aluminum copper, tungsten, titanium, tantalum, a combination of the foregoing, or the like. The redistribution layer 112 may, for example, be or comprise aluminum, copper, tungsten, a combination of the foregoing, or the like. The conductive wires 108 include an upper layer 108u1 vertically above the redistribution layer 112. The upper layer 108u1 of the conductive wires 108 includes a conductive bond layer 108b and a cavity electrode 108a. In some embodiments, the conductive bond layer 108b may be or comprise aluminum, copper, aluminum copper, or the like.

The MEMS device 302 includes a moveable membrane 136, a cavity 120, a dielectric structure 130, a conductive bond structure 122, a plurality of stopper structures 118a-c, one or more contact vias 204, and the cavity electrode 108a. A MEMS substrate 134 overlies the interconnect structure and an isolation dielectric layer 132 is disposed along a lower surface of the MEMS substrate 134. The cavity 120 is defined between a lower surface of the isolation dielectric layer 132 and an upper surface of the interconnect structure 104. The dielectric structure 130 is disposed between the interconnect structure 104 and the isolation dielectric layer 132. The dielectric structure 130 includes a first dielectric layer 124, a second dielectric layer 126, and a third dielectric layer 128. In some embodiments, the first dielectric layer 124 may, for example, be or comprise aluminum oxide (e.g., $Al_2O_3$), another metal oxide, or the like and/or may have a thickness t3 of about 300 Angstroms, or within a range of about 285 to 315 Angstroms. In some embodiments, the second dielectric layer 126 may, for example, be or comprise silicon nitride, silicon carbide, or the like and/or may have a thickness t4 of about 300 Angstroms or within a range of about 285 to 315 Angstroms. In further embodiments, the third dielectric layer 128 may, for example, be or comprise an oxide such as silicon dioxide, another suitable oxide, or the like and/or may have a thickness t5 of about 2,000 Angstroms or within a range of about 1,900 to 2,100 Angstroms. In some embodiments, an upper region 106ur of the interconnect dielectric structure 106 may have a thickness t2 of about 200 Angstroms, greater than about 100 Angstroms, or within a range of about 190 to 210 Angstroms. In some embodiments, if the thickness t2 is greater than about 100 Angstroms, then the upper region 106ur of the interconnect dielectric structure 106 may be configured to prevent stress and/or damage to the upper layer 108u1 of the conductive wires 108. In some embodiments, the dielectric structure 130 has a thickness t1.

In some embodiments, the thickness t2 of the upper region 106ur of the interconnect dielectric structure 106, the thickness t3 of the first dielectric layer 124, and/or the thickness t4 of the second dielectric layer 126 may, for example, respectively be fixed to an initial value. In such embodiments, the thickness t1 of the dielectric structure 130 may be adjusted by changing the thickness t5 of the third dielectric layer 128 to a suitable value. Thus, the distance ds between the moveable membrane 136 and the third stopper structure 118c may be set by properly setting the thickness t5 of the third dielectric layer 128. In further embodiments, because the third dielectric layer 128 is formed by a deposition process (e.g., high density plasma (HDP) chemical vapor deposition (CVD)) that has a high control of the thickness t5 (i.e., forming the third dielectric layer 128 to a predefined thickness with an error within a range of +/−5%), the distance ds may be formed to a target value with an error within a range of about +/−5% of the target value. This in turn increases a performance and sensitivity of the MEMS device 302.

The conductive bond structure 122 is disposed between the isolation dielectric layer 132 and the conductive bond layer 108b. In some embodiments, the dielectric structure 130 continuously surrounds an outer perimeter of the conductive bond structure 122. In some embodiments, the conductive bond structure 122 may, for example be or comprise germanium, another suitable conductive material, or the like. In some embodiments, during fabrication of the integrated chip 300, the conductive bond structure 122 may be bonded to the conductive bond layer 108b, thereby sealing the cavity 120 with a first gas pressure.

The moveable membrane 136 is disposed within the MEMS substrate 134 and overlies the cavity 120. A trench 202 laterally surrounds the moveable membrane 136 and may be configured to electrically isolate the moveable membrane 136 from other devices disposed within and/or on the MEMS substrate 134. The trench 202 continuously extends from an upper surface of the MEMS substrate 134 to a bottom surface of the first dielectric layer 124, such that an upper surface of the interconnect dielectric structure 106 is exposed. One or more contact vias 204 extend from the conductive wires 108 in the interconnect structure 104 through the dielectric structure 130 to contact the moveable membrane 136. The one or more contact vias 204 are configured to electrically couple the moveable membrane 136 to the conductive wires and vias 108, 110.

The moveable membrane 136 is separated from a lower surface of the cavity 120 by a distance ds. The cavity electrode 108a is disposed within the interconnect dielectric structure 106 and is separated from the cavity 120 by the upper region 106ur of the interconnect dielectric structure 106. The plurality of stopper structures 118a-c are disposed within the cavity 120 and overlie the cavity electrode 108a. A first stopper structure 118a and a second stopper structure 118b each comprise a first stopper layer 114 and a second stopper layer 116. In some embodiments, the first stopper layer 114 may, for example, be or comprise aluminum oxide (e.g., $Al_2O_3$), another metal oxide, or the like. In further embodiments, the second stopper layer 116 may, for example, be or comprise silicon nitride, silicon carbide, or the like. The third stopper structure 118c may, for example, be or comprise aluminum oxide (e.g., $Al_2O_3$), another metal oxide, or the like. In some embodiments, the third stopper structure 118c may, for example, have a same thickness as the first dielectric layer 124 (not shown). In some embodiments, an upper surface of each stopper structure 118a-c may be rough and/or may comprise a plurality of protrusions configured to prevent stiction with the isolation dielectric layer 132 and/or the moveable membrane 136. In further embodiments, the third stopper structure 118c is configured as a sensing electrode, such that a capacitance may be detected between the third stopper structure 118c and the moveable membrane 136.

Figure 4:
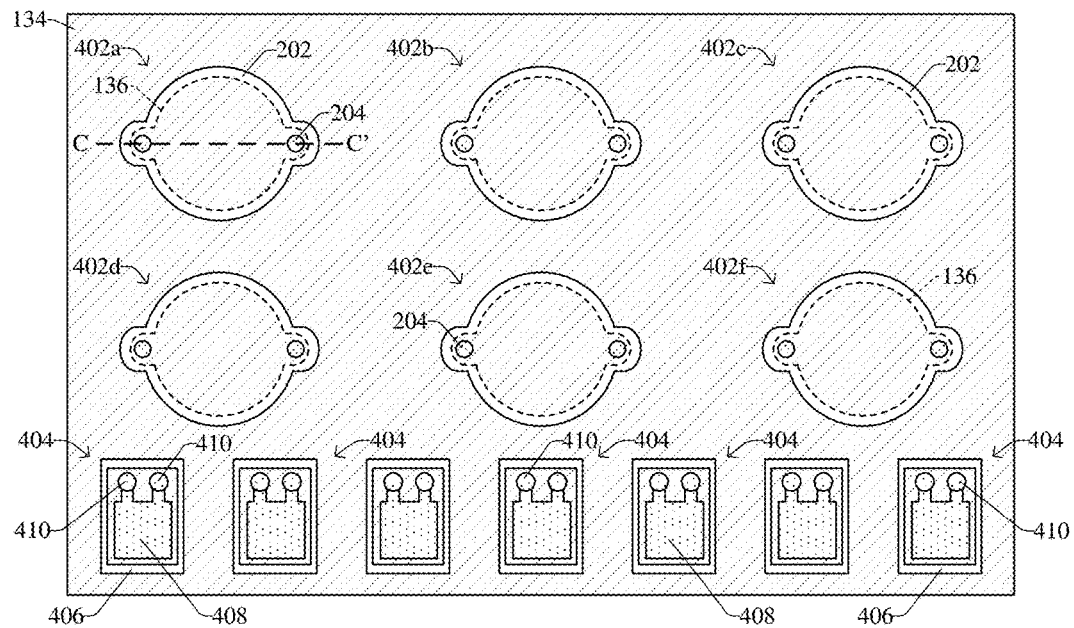
FIG. 4 illustrates a top view of some alternative embodiments of the MEMS device of FIG. 3.

FIG. 4 illustrates a top view 400 of some alternative embodiments of the integrated chip 300 of FIG. 3 taken along line C-C'. FIG. 3 illustrates some embodiments of a cross-sectional view of a portion of the top view 400 of FIG. 4 taken along the line C-C'.

As illustrated in the top view 400 of FIG. 4, a plurality of MEMS devices 402a-f are disposed in an array comprising rows and columns. In some embodiments, each MEMS device 402a-f is configured as the MEMS device 302 of FIG. 3. A trench 202 laterally surrounds an outer perimeter of each MEMS device 402a-f and is configured to electrically isolate the MEMS devices 402a-f from one another. Further, a plurality of contact pads 404 are laterally offset from the MEMS devices 402a-f. The contact pads 404 are configured to electrically couple the MEMS devices 402a-f to another semiconductor device (not shown) by way of, for example, a bond wire (not shown). The contact pads 404 each comprise a contact pad body 408 and contact pad vias 410. In some embodiments, the contact pad vias 410 extend into the MEMS substrate 134 to contact a metal feature (e.g., a conductive wire 108 of FIG. 3, a conductive via 110 of FIG. 3, etc.) of the interconnect structure (104 of FIG. 3). Further, the contact pads 404 may be electrically coupled to the MEMS devices 402a-f by way of the interconnect structure (104 of FIG. 3). Additionally, a contact pad trench 406 laterally surrounds each contact pad body 408 and contact pad vias 410, in which the contact pad trench 406 is configured to electrically isolate the contact pads 404 from other devices disposed within and/or on the MEMS substrate 134. In some embodiments, the contact pad body 408 and/or the contact pad vias 410 may, for example, each be or comprise aluminum, copper, aluminum copper, or the like.

Figure 5A:
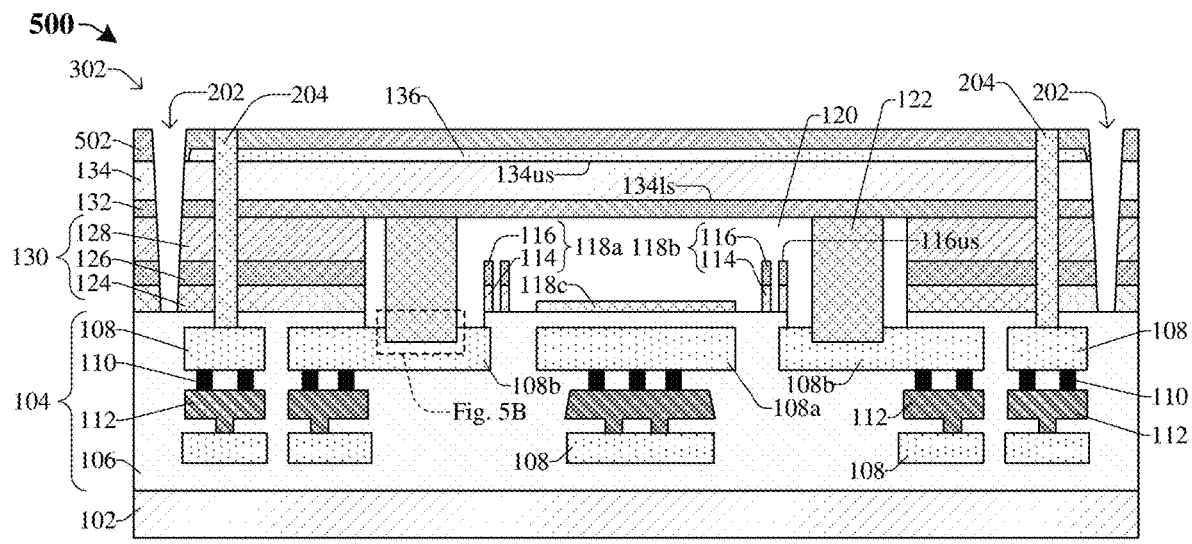
FIG. 5A illustrates a cross-sectional view of some embodiments of a MEMS device having a moveable membrane overlying a cavity.

FIG. 5A illustrates a cross-sectional view of an integrated chip 500 according to some alternative embodiments of the integrated chip 300 of FIG. 3.

As illustrated in FIG. 5A, the moveable membrane 136 may be configured as a moveable membrane electrode, such that the moveable membrane 136 may be or comprise aluminum, copper, aluminum copper, titanium, tantalum, a combination of the foregoing, or the like. Further, an upper isolation layer 502 may overlie the MEMS substrate 134. In such embodiments, the MEMS substrate 134, the upper isolation layer 502, and the isolation dielectric layer 132 may be configured as a silicon-on-insulator (SOI) substrate. In some embodiments, the upper isolation layer 502 may, for example, be or comprise an oxide, such as silicon dioxide, another suitable dielectric material, or the like. Further, a lower surface of the moveable membrane 136 may be disposed along an upper surface 134us of the MEMS substrate 134. In some embodiments, an upper surface of the moveable membrane 136 may be disposed along a lower surface 134ls of the MEMS substrate 134 (not shown). In further embodiments, the lower surface of the moveable membrane 136 may be disposed along the lower surface 134ls of the MEMS substrate 134.

Figure 5B:
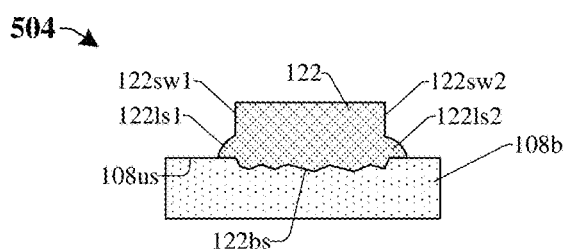
FIGS. 5B-C illustrate cross-sectional views of some embodiments of sections of the MEMS device of FIG. 5A.

FIG. 5B illustrates a cross-sectional view 504 of a close up of an interface between the conductive bond structure 122 and the conductive bond layer 108b of FIG. 5A, as indicated by the dashed box.

In some embodiments, a bottom surface 122bs of the conductive bond structure 122 may comprise a plurality of protrusions that extend below an upper surface 108us of the conductive bond layer 108b. Further, the conductive bond structure 122 may comprise lateral segments 122ls1, 122ls2 that extend laterally from sidewalls 122sw1, 122sw2 of the conductive bond structure 122 to over the upper surface 108us, respectively. In some embodiments, the lateral segments 122ls1, 122ls2 may be due to a force and/or temperature disposed upon the conductive bond structure 122 during fabrication of the integrated chip 500.

Figure 5C:
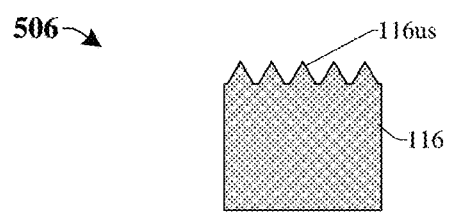

FIG. 5C illustrates a cross-sectional view 506 of an upper surface 116us of the second stopper layer 116 of FIG. 5A. As illustrated in FIG. 5C the upper surface 116us of the second stopper layer 116 may comprise a plurality of protrusions configured to reduce stiction with the isolation dielectric layer 132. In some embodiments, an upper surface of each of stopper structure 118a-c may be configured as the upper surface 116us (not shown).

Figure 6:
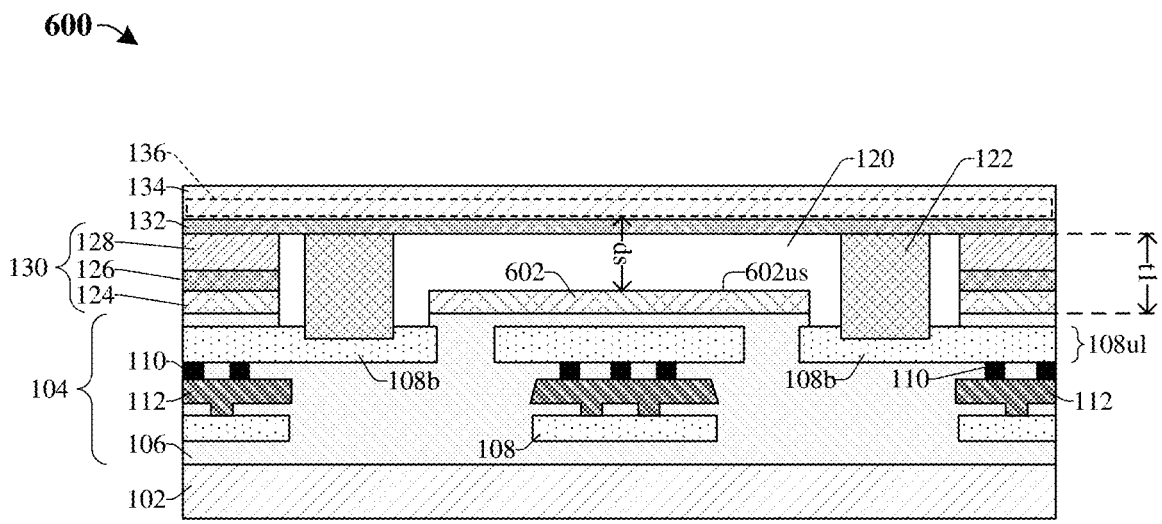
FIG. 6 illustrates a cross-sectional view of some embodiments of a MEMS device having a conductive bond structure surrounded by a dielectric structure, where the conductive bond structure laterally encloses an electrode.

FIG. 6 illustrates a cross-sectional view of some embodiments of a microelectromechanical systems (MEMS) device 600 having a conductive bond structure 122 surrounded by a dielectric structure 130, where the conductive bond structure 122 laterally encloses an upper electrode 602.

In some embodiments, the distance ds is defined between the moveable membrane 136 and an upper surface 602us of the upper electrode 602. The upper electrode 602 abuts the cavity 120. A change in capacitance may be detected between the moveable membrane 136 and the upper electrode 602. The upper electrode 602 may, for example, be electrically coupled to a conductive wire 108 in the interconnect structure 104. In further embodiments, a thickness of the upper electrode 602 may be equal to a thickness of the first dielectric layer 124 and/or the upper electrode 602 and the first dielectric layer 124 may comprise a same material (e.g., a metal oxide).

FIGS. 7-13 illustrate cross-sectional views 700-1300 of some embodiments of a method of forming a microelectromechanical systems (MEMS) device having a conductive bond structure surrounded by a dielectric structure according to aspects of the present disclosure. Although the cross-sectional views 700-1300 shown in FIGS. 7-13 are described with reference to a method, it will be appreciated that the structures shown in FIGS. 7-13 are not limited to the method but rather may stand alone separate of the method. Although FIGS. 7-13 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 7:
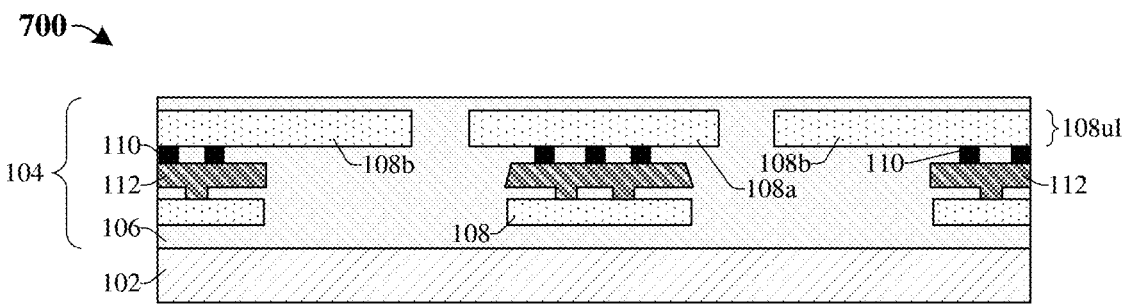
FIGS. 7-13 illustrate cross-sectional views of some embodiments of a method of forming a MEMS device having a conductive bond structure surrounded by a dielectric structure.

As shown in cross-sectional view 700 of FIG. 7, a substrate 102 is provided and an interconnect structure is formed over a front-side surface of the substrate 102. The interconnect structure 104 includes an interconnect dielectric structure 106, a plurality of conductive wires 108, a plurality of conductive vias 110, and a redistribution layer 112. In some embodiments, the interconnect dielectric structure 106 may be or comprise one or more inter-level dielectric (ILD) layers. The one or more ILD layers may, for example, be or comprise an oxide, such as silicon dioxide, a low-k dielectric material, or another suitable dielectric material. In some embodiments, a process for forming the interconnect structure 104 includes forming the conductive wires 108, the redistribution layer 112, and/or the conductive vias 110 by a single damascene process or a dual damascene process. In some embodiments, the conductive wires and/or vias 108, 110 may, for example, be or comprise aluminum, copper, aluminum copper, tungsten, titanium, a combination of the foregoing, or the like. An upper layer 108u1 of the conductive wires 108 includes a conductive bond layer 108b and a cavity electrode 108a.

Figure 8:
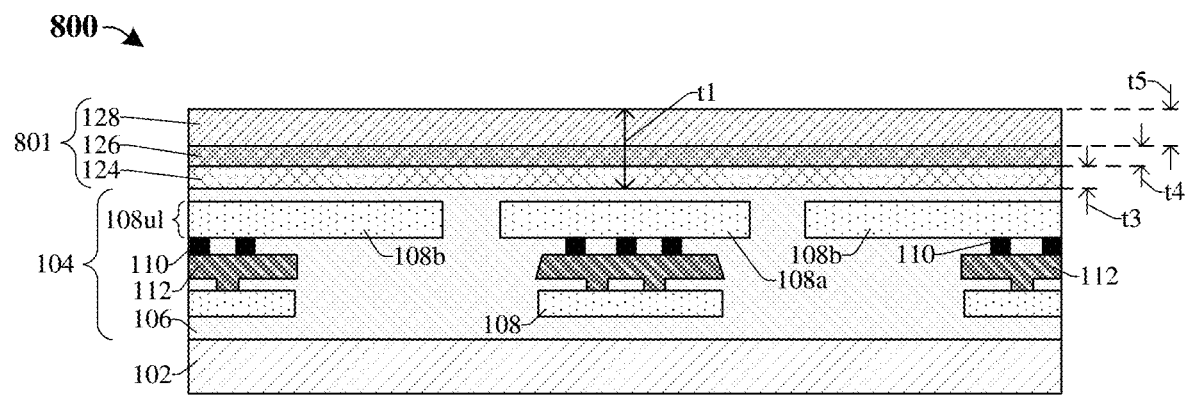

As shown in cross-sectional view 800 of FIG. 8, a stack of dielectric layers 801 is formed over the interconnect structure 104. In some embodiments, the stack of dielectric layers 801 includes a first dielectric layer 124, a second dielectric layer 126, and a third dielectric layer 128. In some embodiments, the first dielectric layer 124 may, for example, be or comprise aluminum oxide (e.g., $Al_2O_3$), another metal oxide, or the like and/or may have a thickness t3 of about 300 Angstroms, or within a range of about 285 to 315 Angstroms. In some embodiments, the second dielectric layer 126 may, for example, be or comprise silicon nitride, silicon carbide, or the like and/or may have a thickness t4 of about 300 Angstroms or within a range of about 285 to 315 Angstroms. In further embodiments, the third dielectric layer 128 may, for example, be or comprise an oxide such as silicon dioxide, another suitable oxide, or the like and/or may have a thickness t5 of about 2,000 Angstroms or within a range of about 1,900 to 2,100 Angstroms. In some embodiments, the stack of dielectric layers 801 has a thickness t1. In some embodiments, the dielectric layers within the stack of dielectric layers 801 may each be formed by physical vapor deposition (PVD), chemical vapor deposition (CVD), plasma-enhanced chemical vapor deposition (PECVD), thermal oxidation, or another suitable deposition or growth process.

In some embodiments, the first second and/or third dielectric layers 124, 126, 128 may each be formed by a CVD process with, for example, a +/−5% process control of a thickness of the layer. For example, if a target thickness of the third dielectric layer 128 is 2,000 Angstroms, then the third dielectric layer 128 may be formed by a high density plasma (HDP) CVD process, such that the thickness t5 of the third dielectric layer 128 is within a range of about 1,900 to 2,100 Angstroms. Thus, the thickness t1 of the stack of dielectric layers 801 may be precisely formed, such that the thickness t1 has a +/−5% tolerance of a target thickness.

Figure 9:
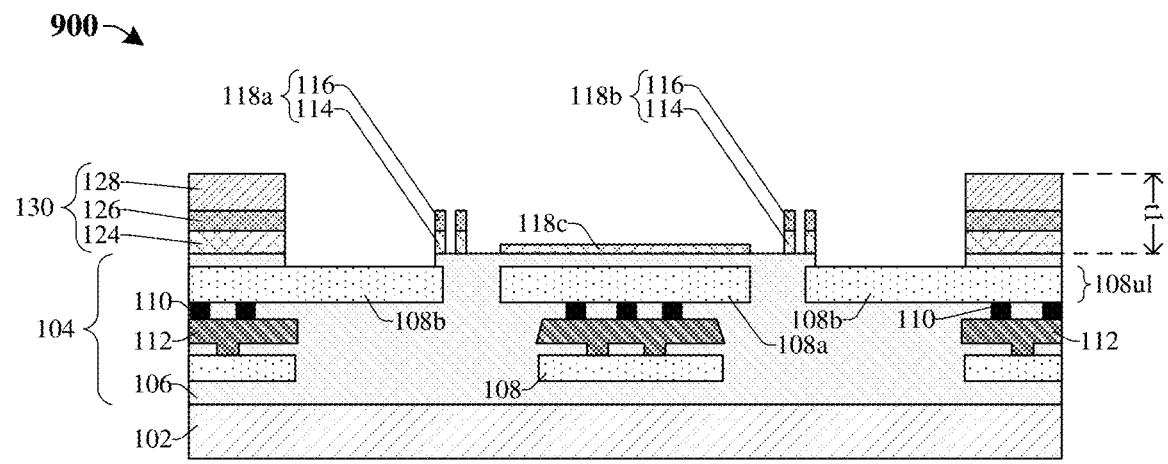

As shown in cross-sectional view 900 of FIG. 9, one or more etch processes are performed on the structure of FIG. 8 to define a dielectric structure 130 and a plurality of stopper structures 118a-c, and to expose an upper surface of the conductive bond layer 108b. The one or more etch processes may include performing a first etch process to define the dielectric structure 130. The first etch process may include: forming a masking layer (not shown) over the third dielectric layer 128; exposing unmasked regions of the third dielectric layer 128 and underlying layers to one or more etches, thereby defining the dielectric structure 130; and performing a removal process to remove the masking layer. Further, the one or more etch processes may include performing a second etch process to define a first stopper structure 118a and/or a second stopper structure 118b. The second etch process may include: forming a masking layer (not shown) over the third dielectric layer 128; exposing unmasked regions of the third dielectric layer 128 and underlying layers to one or more etchants, thereby defining the first and second stopper structures 118a-b; and performing a removal process to remove the masking layer. Further, a third etch process may be performed to define a third stopper structure 118c. In yet further embodiments, the third etch process may remove the third stopper structure 118c and may expose an upper surface of the cavity electrode 108a (not shown). Furthermore, a fourth etch process may be performed to expose the upper surface of the conductive bond layer 108b.

In some embodiments, the first stopper structure 118a and the second stopper structure 118b each comprise a first stopper layer 114 and a second stopper layer 116. In some embodiments, the first stopper layer 114 may, for example, be or comprise aluminum oxide (e.g., $Al_2O_3$), another metal oxide, or the like. In further embodiments, the second stopper layer 116 may, for example, be or comprise silicon nitride, silicon carbide, or the like. The third stopper structure 118c may, for example, be or comprise aluminum oxide (e.g., $Al_2O_3$), another metal oxide, or the like. In some embodiments, an upper surface of each stopper structure 118a-c may be rough and/or may comprise a plurality of protrusions configured to prevent stiction, such that the stopper structures 118a-c may be configured as an anti-stiction structure.

Figure 10:
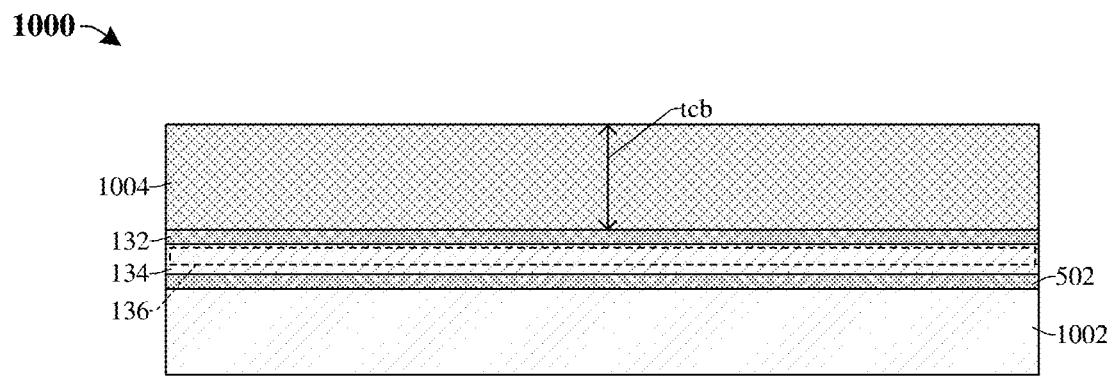

As shown in cross-sectional view 1000 of FIG. 10, a sacrificial substrate 1002 is provided and a MEMS substrate 134 is bonded to the sacrificial substrate 1002 by way of an upper isolation layer 502. In some embodiments, the sacrificial substrate 1002 may, for example, be a bulk substrate (e.g., a bulk silicon substrate), or some other suitable substrate. The upper isolation layer 502 may, for example, be or comprise an oxide, such as silicon dioxide, or another suitable dielectric material, and/or may be formed by CVD, PVD, thermal oxidation, or another suitable deposition process. The MEMS substrate 134 is provided and subsequently bonded to the upper isolation layer 502. In some embodiments, the MEMS substrate 134 may, for example, be a bulk substrate (e.g., a bulk silicon substrate), or some other suitable substrate. In some embodiments, the bonding process may include performing a fusion bond process. A moveable membrane 136 is formed within the MEMS substrate 134. In some embodiments, the moveable membrane 136 may be formed by a selective ion implantation process. The selective ion implantation process may include: forming a masking layer (not shown) over the MEMS substrate 134; selectively implanting dopants (e.g., n-type dopants) into unmasked regions of the MEMS substrate 134; and performing a removal process to remove the masking layer. In further embodiments, the moveable membrane 136 may be formed by, for example, CVD, PVD, electroless plating, sputtering, or another suitable growth or deposition process (not shown). In yet further embodiments, the moveable membrane 136 may be formed over the MEMS substrate 134 (not shown) and may comprise aluminum, copper, titanium, tantalum, or the like.

Further, as illustrated in the cross-sectional view 1000 of FIG. 10, an isolation dielectric layer 132 is formed over the MEMS substrate 134 and/or the moveable membrane 136. In some embodiments, the isolation dielectric layer 132 may, for example, be or comprise an oxide, such as silicon dioxide, another suitable dielectric material, or the like. A conductive bond layer 1004 is formed over the isolation dielectric layer 132. In some embodiments, the conductive bond layer 1004 may be formed by, for example, CVD, PVD, electroless plating, sputtering, or another suitable deposition or growth process. Further, in some embodiments, the conductive bond layer 1004 may, for example, be or comprise germanium, gold, nickel, a combination of the foregoing, or the like and/or may have a thickness tcb of about 3,800 Angstroms or within a range of about 3,610 to 3,980.

Figure 11:
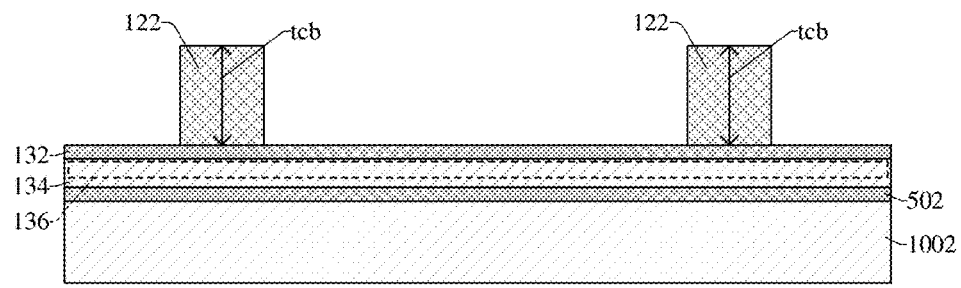

As shown in cross-sectional view 1100 of FIG. 11, the conductive bond layer (1004 of FIG. 10) is patterned, thereby defining a conductive bond structure 122. The conductive bond structure 122 has the thickness tcb. In some embodiments, patterning the conductive bond layer (1004 of FIG. 10) may include: forming a masking layer (not shown) over the conductive bond layer (1004 of FIG. 10); exposing unmasked regions of the conductive bond layer (1004 of FIG. 10) to one or more etchants, thereby defining the conductive bond structure 122; and performing a removal process to remove the masking layer.

As shown in cross-sectional view 1200 of FIG. 12, the structure of FIG. 11 is rotated 180 degrees and subsequently the conductive bond structure 122 is bonded to the conductive bond layer 108b, thereby sealing a cavity 120 with a first gas pressure. In further embodiments, the bonding process may also seal an outer cavity 1204 with a second gas pressure. The outer cavity 1204 is defined between an inner sidewall of the dielectric structure 130 and an outer sidewall of the conductive bond structure 122. In some embodiments, the bonding process includes performing a eutectic bond. In such embodiments, the eutectic bond may reach a maximum bonding temperature of about 420 degrees Celsius, or 500 degrees Celsius. In further embodiments, the eutectic bond may include applying a bond force to an upper surface of the sacrificial substrate 1002 towards the substrate 102. In some embodiments, the bond force may, for example, be within a range of about 30 to 40 kilonewtons (KN). In some embodiments, during the eutectic bond the maximum bonding temperature and/or the bond force may result in a reduction of the thickness tcb of the conductive bond structure 122. This, in part, may be because the conductive bond structure 122 is squished against the conductive bond layer 108b and materials from the conductive bond structure 122 are forced laterally along an upper surface 108us of the conductive bond layer 108b (e.g., see dashed box 1202). In further embodiments, a bottom surface 122bs of the conductive bond structure 122 may be disposed vertically below the upper surface of the conductive bond layer 108b. In yet further embodiments, during the eutectic bond, the dielectric structure 130 may act as a bond stop structure, such that the reduction of the thickness tcb of the conductive bond structure 122 stops as a lower surface of the isolation dielectric layer 132 contacts an upper surface of the dielectric structure 130. Thus, a distance ds between the moveable membrane 136 and the third stopper structure 118c is defined by the thickness t1 of the dielectric structure 130. In yet further embodiments, if the dielectric structure 130 is omitted (not shown) then an accurate control of the distance ds is mitigated or eliminated. Therefore, by accurately defining the thickness t1 of the dielectric structure 130 (e.g., by utilizing the deposition process of FIG. 8) to a suitable value, the distance ds may be accurately defined.

The dashed box 1202 illustrates some embodiments of a close-up of the interface between the conductive bond structure 122 and the conductive bond layer 108b after the eutectic bonding process. The bottom surface 122bs of the conductive bond structure 122 may comprise a plurality of protrusions that extend below the upper surface 108us of the conductive bond layer 108b. Further, the conductive bond structure 122 may comprise lateral segments 122ls1, 122ls2 that extend laterally from sidewalls 122sw1, 122sw2 of the conductive bond structure 122 to over the upper surface 108us, respectively. In some embodiments, the lateral segments 122ls1, 122ls2 may be due to the bond force and/or the maximum bonding pressure causing material from a body of the conductive bond structure 122 to be force laterally outside of the sidewalls 122sw1, 122sw2. This in turn may result in the reduction of the thickness tcb. In some embodiments, the second stopper layer 116 may, for example, be configured as a barrier and/or a wall to prevent the lateral segments 122ls1, 122ls2 of the conductive bond structure 122 from extending laterally over the cavity electrode 108a. This in turn may, for example, prevent an electrical shorting between the moveable membrane 136 and/or the cavity electrode 108a and the lateral segments 122ls1, 122ls2

Figure 12:
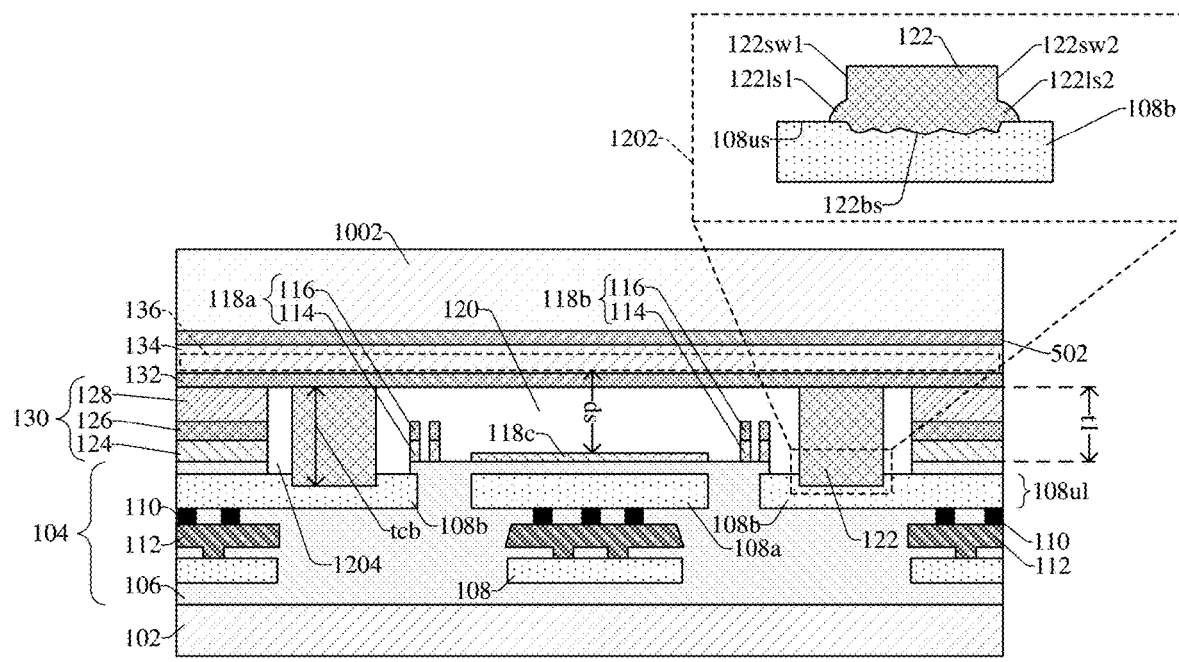
Figure 13:
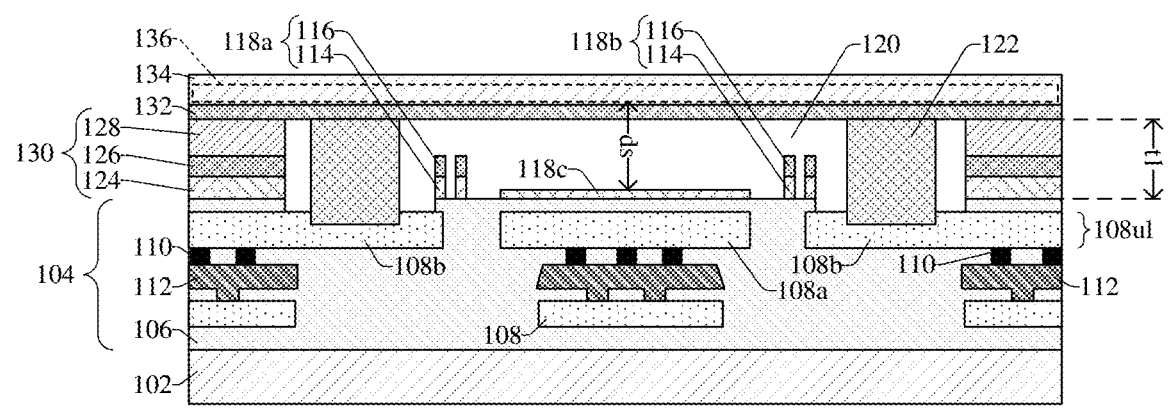

As shown in cross-sectional view 1300 of FIG. 13, a removal process is performed to remove the sacrificial substrate (1002 of FIG. 12) and/or the upper isolation layer (502 of FIG. 12). In some embodiments, the removal process may include performing an etch process (e.g., a blanket etch), a planarization process (e.g., a CMP process), a grinding process (e.g., a mechanical grinding process), a combination of the foregoing, or another suitable removal process.

Figure 14:
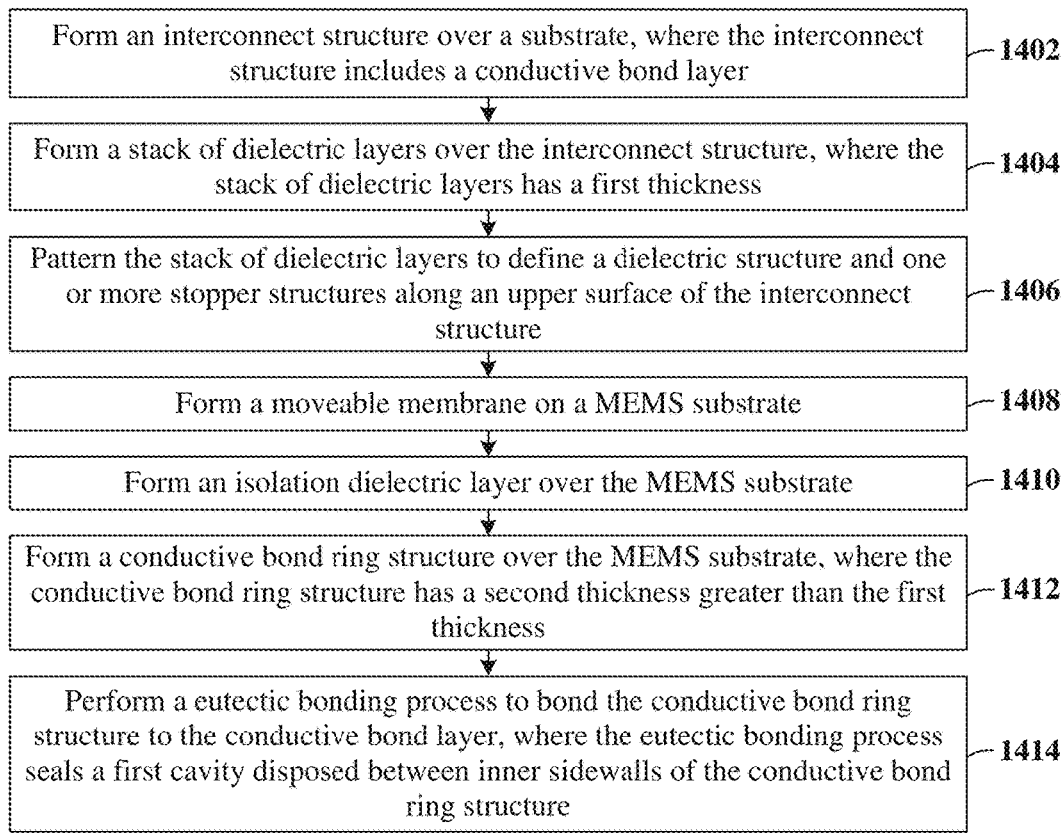
FIG. 14 illustrates some embodiments of a method of forming a MEMS device having a conductive bond structure surrounded by a dielectric structure.

FIG. 14 illustrates a method 1400 of forming a microelectromechanical systems (MEMS) device having a conductive bond structure surrounded by a dielectric structure according to the present disclosure. Although the method 1400 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1402, an interconnect structure is formed over a substrate. The interconnect structure includes a conductive bond layer. FIG. 7 illustrates a cross-sectional view 700 corresponding to some embodiments of act 1402.

At act 1404, a stack of dielectric layers having a first thickness is formed over the interconnect structure. FIG. 8 illustrates a cross-sectional view 800 corresponding to some embodiments of act 1404.

At act 1406, the stack of dielectric layers is patterned to define a dielectric structure and one or more stopper structures along an upper surface of the interconnect structure. FIG. 9 illustrates a cross-sectional view 900 corresponding to some embodiments of act 1406.

At act 1408, a moveable membrane is formed on a MEMS substrate. FIG. 10 illustrates a cross-sectional view 1000 corresponding to some embodiments of act 1408.

At act 1410, an isolation dielectric layer is formed over the MEMS substrate. FIG. 10 illustrates a cross-sectional view 1000 corresponding to some embodiments of act 1410.

At act 1412, a conductive bond ring structure is formed over the MEMS substrate. The conductive bond ring structure has a second thickness greater than the first thickness. FIGS. 10 and 11 illustrate cross-sectional views 1000 and 1100 corresponding to some embodiments of act 1412.

At act 1414, a eutectic bonding process is performed to bond the conductive bond ring structure to the conductive bond layer. The eutectic bonding process seals a first cavity disposed between inner sidewalls of the conductive bond ring structure. FIG. 12 illustrates a cross-sectional view 1200 corresponding to some embodiments of act 1414.

Accordingly, in some embodiments, the present disclosure relates to a microelectromechanical systems (MEMS) device having a conductive bond structure surrounded by a dielectric structure, in which the conductive bond structure is bonded to an underlying interconnect structure by a eutectic bond.

In some embodiments, the present application provides a microelectromechanical system (MEMS) device including a substrate; an interconnect structure overlying the substrate; a MEMS substrate overlying the interconnect structure, wherein the MEMS substrate includes a moveable membrane; a dielectric structure disposed between the interconnect structure and the MEMS substrate; and a conductive bonding structure sandwiched between the interconnect structure and the MEMS substrate, wherein the conductive bonding structure is spaced laterally between sidewalls of the dielectric structure, wherein the conductive bonding structure, the MEMS substrate, and the interconnect structure at least partially define a cavity, wherein the moveable membrane overlies the cavity and is spaced laterally between sidewalls of the conductive bonding structure.

In some embodiments, the present application provides a microelectromechanical system (MEMS) structure including a substrate; an interconnect structure overlying the substrate, wherein the interconnect structure includes a conductive bond layer; a MEMS substrate overlying the interconnect structure, wherein the MEMS substrate comprises a moveable membrane; a conductive bond ring structure sandwiched between the interconnect structure and the MEMS substrate, wherein the conductive bond ring structure contacts the conductive bond layer of the interconnect structure, wherein the conductive bond ring structure, the MEMS substrate, and the interconnect structure at least partially define a first cavity, wherein the moveable membrane overlies the first cavity and is spaced laterally between sidewalls of the conductive bond ring structure; a dielectric structure sandwiched between the interconnect structure and the MEMS substrate, wherein the conductive bond ring structure is laterally spaced between inner sidewalls of the dielectric structure; and an anti-stiction structure disposed along an upper surface of the interconnect structure and within the first cavity, wherein the anti-stiction structure comprises one or more protrusions extending towards the MEMS substrate, wherein the anti-stiction structure comprises a same material as the dielectric structure.

In some embodiments, the present application provides a method for forming a microelectromechanical system (MEMS) device, the method includes forming an interconnect structure over a substrate, wherein the interconnect structure includes a conductive bond layer; forming a stack of dielectric layers over the interconnect structure having a first thickness; patterning the stack of dielectric layers to define a dielectric structure and one or more stopper structures along an upper surface of the interconnect structure; forming a moveable membrane on a MEMS substrate; forming an isolation dielectric layer over the MEMS substrate; forming a conductive bond ring structure over the MEMS substrate, wherein the conductive bond ring structure has a second thickness greater than the first thickness; and performing a eutectic bonding process to bond the conductive bond ring structure to the conductive bond layer, wherein the eutectic bonding process seals a first cavity disposed between inner sidewalls of the conductive bond ring structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
    forming an interconnect structure over a first substrate;
    forming a dielectric structure over the interconnect structure, wherein the dielectric structure comprises opposing sidewalls defining an opening;
    forming a plurality of stopper structures over the interconnect structure and within the opening, wherein the stopper structures are formed concurrently with the dielectric structure;
    forming a conductive bonding structure on a second substrate; and
    performing a bonding process to bond the conductive bonding structure to the interconnect structure, wherein the conductive bonding structure is disposed in the opening, wherein the bonding process defines a first cavity between inner opposing sidewalls of the conductive bonding structure and a second cavity between the conductive bonding structure and the opposing sidewalls of the dielectric structure.

2. The method of claim 1, wherein the conductive bonding structure directly contacts a conductive structure in the interconnect structure.

3. The method of claim 1, wherein the dielectric structure has a first thickness that is less than a second thickness of the conductive bonding structure.

4. The method of claim 1, wherein the bonding process comprises performing a eutectic bonding process.

5. The method of claim 4, wherein the eutectic bonding process reaches a temperature of about 420 Celsius or more and comprises applying a bonding force of about 30 to 40 kilonewtons on the second substrate.

6. The method of claim 1, wherein forming the plurality of stopper structures and dielectric structure comprises:
    depositing a first dielectric layer over the interconnect structure;
    depositing a second dielectric layer on the first dielectric layer;
    depositing a third dielectric layer on the second dielectric layer; and
    performing an etching process on the first, second, and third dielectric layers, wherein the etching process defines the opening.

7. The method of claim 6, wherein the first, second, and third dielectric layers each comprise a dielectric material different from one another.

8. A method for forming an integrated chip, the method comprising:
    forming an electrode within a lower dielectric structure;
    depositing a stack of dielectric layers over the lower dielectric structure;
    patterning the stack of dielectric layers to form an upper dielectric structure, wherein the electrode is disposed between opposing sidewalls of the upper dielectric structure; and
    bonding a microelectromechanical system (MEMS) substrate to the lower dielectric structure, wherein a bonding structure is disposed between the MEMS substrate and lower dielectric structure, wherein the bonding structure comprises a different material than the upper dielectric structure, and wherein a bottom surface of the bonding structure is disposed below a bottom surface of the upper dielectric structure.

9. The method of claim 8, wherein the MEMS substrate comprises a moveable membrane overlying the electrode.

10. The method of claim 8, wherein the upper dielectric structure is formed with a first thickness and the bonding structure is formed with a second thickness greater than the first thickness.

11. The method of claim 8, wherein forming the bonding structure comprises:
depositing a bonding layer on the MEMS substrate; and
etching the bonding layer to a ring-shape.

12. The method of claim 8, wherein bonding the MEMS substrate to the lower dielectric structure comprises performing a eutectic bonding process.

13. The method of claim 8, wherein bonding the MEMS substrate to the lower dielectric structure seals a cavity between outer sidewalls of the bonding structure and inner sidewalls of the upper dielectric structure.

14. The method of claim 8, wherein a top surface of the upper dielectric structure is aligned with a top surface of the bonding structure.

15. A method for forming an integrated chip, the method comprising:
forming an interconnect structure over a substrate;
forming one or more dielectric layers over the interconnect structure;
patterning the one or more dielectric layers while the one or more dielectric layers are disposed on the interconnect structure to define a dielectric structure having a first thickness;
forming an isolation dielectric layer on a microelectromechanical system (MEMS) substrate;
forming a conductive bond ring structure on the MEMS substrate, wherein the conductive bond ring structure has a second thickness greater than the first thickness; and
performing a bonding process to bond the conductive bond ring structure to the interconnect structure, wherein the bonding process seals a first cavity disposed between inner sidewalls of the conductive bond ring structure.

16. The method of claim 15, wherein the second thickness of the conductive bond ring structure is reduced during the bonding process, wherein the reduction of the second thickness ceases when a lower surface of the isolation dielectric layer contacts an upper surface of the dielectric structure.

17. The method of claim 15, wherein forming the one or more dielectric layers includes:
depositing a first dielectric layer over the interconnect structure with a first dielectric thickness, wherein the first dielectric layer is deposited by a first chemical vapor deposition (CVD) process;
depositing a second dielectric layer over the first dielectric layer with the first dielectric thickness, wherein the second dielectric layer is deposited by a second CVD process; and
depositing a third dielectric layer over the second dielectric layer with a second dielectric thickness greater than the first dielectric thickness, wherein the third dielectric layer is deposited by a high density plasma CVD process.

18. The method of claim 15, wherein a top surface of the conductive bond ring structure is substantially aligned with a top surface of the dielectric structure.

19. The method of claim 15, wherein the bonding process seals the first cavity with a first gas pressure and seals a second cavity with a second gas pressure, wherein the second cavity is defined between an outer perimeter of the conductive bond ring structure and a sidewall of the dielectric structure.

20. The method of claim 15, wherein patterning the one or more dielectric layers further defines a plurality of stopper structures between sidewalls of the dielectric structure.

* * * * *